(12) United States Patent
Han

(10) Patent No.: US 9,450,017 B2
(45) Date of Patent: Sep. 20, 2016

(54) SEMICONDUCTOR LIGHT EMITTING DEVICE AND METHOD OF FABRICATING THE SAME

(75) Inventor: Jae Cheon Han, Gwangju (KR)

(73) Assignee: LG INNOTEK CO., LTD., Seoul (KR)

( * ) Notice: Subject to any disclaimer, the term of this patent is extended or adjusted under 35 U.S.C. 154(b) by 359 days.

(21) Appl. No.: 12/666,228

(22) PCT Filed: Jun. 18, 2008

(86) PCT No.: PCT/KR2008/003438
§ 371 (c)(1),
(2), (4) Date: Dec. 22, 2009

(87) PCT Pub. No.: WO2008/156294
PCT Pub. Date: Dec. 24, 2008

(65) Prior Publication Data
US 2010/0320491 A1     Dec. 23, 2010

(30) Foreign Application Priority Data

Jun. 21, 2007 (KR) .................. 10-2007-0060931

(51) Int. Cl.
*H01L 33/00* (2010.01)
*H01L 27/15* (2006.01)
*H01L 33/08* (2010.01)
*H01L 33/38* (2010.01)

(52) U.S. Cl.
CPC ............. *H01L 27/15* (2013.01); *H01L 33/08* (2013.01); *H01L 33/385* (2013.01)

(58) Field of Classification Search
CPC ...... H01L 27/15; H01L 33/08; H01L 33/385

USPC ........... 257/79–103, E33.001–E33.077, 324; 438/22–47
See application file for complete search history.

(56) References Cited

U.S. PATENT DOCUMENTS

| | | | | |
|---|---|---|---|---|
| 6,023,076 A * | 2/2000 | Shibata | .................. | H01L 33/32 257/103 |
| 6,100,103 A * | 8/2000 | Shim | .................. | H01L 25/0756 257/E27.12 |
| 6,153,894 A * | 11/2000 | Udagawa | ............... | B82Y 20/00 257/103 |
| 6,352,777 B1 * | 3/2002 | Bulovic | ................. | B82Y 10/00 136/263 |
| 6,593,597 B2 * | 7/2003 | Sheu | ..................... | H01L 25/167 257/94 |
| 7,064,354 B2 * | 6/2006 | Chen | ................... | H01L 25/0756 257/77 |

(Continued)

FOREIGN PATENT DOCUMENTS

| | | |
|---|---|---|
| JP | 6-188456 A | 7/1994 |
| JP | 10-65215 A | 3/1998 |

(Continued)

OTHER PUBLICATIONS

Machine translation, KR 10-2004-0040900.*

(Continued)

*Primary Examiner* — Mohammed Shamsuzzaman
(74) *Attorney, Agent, or Firm* — Birch, Stewart, Kolasch & Birch, LLP

(57) ABSTRACT

A semiconductor light emitting device comprises a first electrode contacting layer, a first active layer on the first electrode contacting layer, a second electrode contacting layer on the first active layer, a second active layer on the second electrode contacting layer, and a third electrode contacting layer on the second active layer.

17 Claims, 5 Drawing Sheets

(56) References Cited

U.S. PATENT DOCUMENTS

| | | | |
|---|---|---|---|
| 7,098,543 B2* | 8/2006 | Lai | H01L 25/167 257/666 |
| 7,642,560 B2 | 1/2010 | Ogihara | |
| 8,624,270 B2* | 1/2014 | Park | H01L 25/0756 257/79 |
| 2002/0041148 A1* | 4/2002 | Cho | H01L 27/15 313/499 |
| 2003/0010993 A1* | 1/2003 | Nakamura | H01L 33/32 257/99 |
| 2003/0080344 A1* | 5/2003 | Yoo | H01L 33/0079 257/103 |
| 2003/0151044 A1* | 8/2003 | Yamada | B82Y 20/00 257/14 |
| 2005/0161683 A1* | 7/2005 | Hahm | H01L 25/0753 257/79 |
| 2005/0184659 A1* | 8/2005 | Ibe | H01L 27/3202 313/506 |
| 2005/0194634 A1* | 9/2005 | Ishikawa | B82Y 20/00 257/324 |
| 2006/0057817 A1* | 3/2006 | Sonoda | H01L 33/0079 438/455 |
| 2006/0124954 A1* | 6/2006 | Akaishi | H01L 33/38 257/99 |
| 2006/0160257 A1* | 7/2006 | Wu | H01L 25/0753 438/22 |
| 2006/0214596 A1* | 9/2006 | Miller | G09G 3/3233 315/169.3 |
| 2006/0231852 A1* | 10/2006 | Kususe | H01L 24/06 257/99 |
| 2006/0243988 A1* | 11/2006 | Narukawa | H01L 33/32 257/79 |
| 2006/0256826 A1* | 11/2006 | Lin | H01L 25/0753 372/43.01 |
| 2007/0029568 A1* | 2/2007 | Choo | H01L 33/40 257/99 |
| 2007/0063207 A1* | 3/2007 | Tanizawa | B82Y 20/00 257/94 |
| 2007/0069220 A1* | 3/2007 | Ogihara | H01L 25/0753 257/79 |
| 2007/0069222 A1* | 3/2007 | Ko | H01L 33/642 257/86 |
| 2007/0284598 A1* | 12/2007 | Shakuda | H01L 27/156 257/93 |
| 2008/0089368 A1* | 4/2008 | Feng | B82Y 20/00 372/25 |
| 2008/0093611 A1* | 4/2008 | Hahn | H01L 33/22 257/95 |
| 2009/0218941 A1* | 9/2009 | Nakamura | H01L 51/057 313/506 |
| 2009/0285253 A1* | 11/2009 | Masui | H01S 5/1833 372/45.01 |
| 2010/0148196 A1* | 6/2010 | Kamada | F21K 9/00 257/98 |
| 2011/0220945 A1* | 9/2011 | Kang | H01L 27/15 257/98 |
| 2013/0292719 A1* | 11/2013 | Lee | H01L 33/08 257/93 |

FOREIGN PATENT DOCUMENTS

| | | | | |
|---|---|---|---|---|
| JP | 11-191639 A | | 7/1999 | |
| JP | H11-330554 | * | 11/1999 | H01L 33/00 |
| JP | 2003-303997 A | | 10/2003 | |
| JP | 2007-095844 A | | 4/2007 | |
| KR | 10-1999-0085730 A | | 12/1999 | |
| KR | 10-2001-0110916 A | | 12/2001 | |
| KR | 10-2004-0040900 | * | 5/2004 | H01L 33/00 |
| KR | 10-2004-0040900 A | | 5/2004 | |
| KR | 10-0459495 | * | 12/2004 | H01L 33/00 |
| WO | WO 2005/106972 | * | 11/2005 | H01L 33/00 |
| WO | WO 2005106972 | * | 11/2005 | H01L 33/00 |
| WO | WO 2006/025497 | * | 3/2006 | H01L 33/00 |
| WO | WO 2006025497 | * | 3/2006 | H01L 33/00 |
| WO | WO 2006/090809 | * | 8/2006 | H01B 33/26 |
| WO | WO 2006090809 | * | 8/2006 | H05B 33/26 |
| WO | WO 2007/034803 | * | 3/2007 | H01L 33/00 |
| WO | WO 2007034803 | * | 3/2007 | H01L 33/00 |
| WO | WO 2007/091762 | * | 8/2007 | H01L 33/00 |

OTHER PUBLICATIONS

Machine translation, Shin, Korean Regsitration No. 10-0459495, translation date Nov. 22, 2014, KIPO, all pages.*
Machine translation, Mitani, Japanese Pat. Pub. No. H11-330554, translation date Nov. 20, 2014, JPO and Japio, all pages.*
Machine translation, Shin, Korean Registration No. 10-0459495, translation date: Nov. 22, 2014, KIPO, all pages.*
Machine translation, Mitani, Japanese Pat. Pub. No. H11-330554, translation date: Nov. 20, 2014, JPO & Japio, all pages.*

\* cited by examiner

SEMICONDUCTOR LIGHT EMITTING DEVICE AND METHOD OF FABRICATING THE SAME

TECHNICAL FIELD

The present disclosure relates to a semiconductor light emitting device and a method of fabricating the same.

BACKGROUND ART

Light emitting diode (LED) can emit light with a variety of colors using properties of compound semiconductor materials such as a GaAs-based compound, an AlGaAs-based compound, a GaN-based compound, an InGaN-based material, and an InGaAlP-based material. The light emitting diodes are packaged and used as light sources in a variety of fields such as a lightening display field, a character display field, and an image display field.

DISCLOSURE OF INVENTION

Technical Problem

Embodiments provide a semiconductor light emitting device that is designed to emit light through a plurality of active layers and a method of fabricating the same.

Embodiments provide a semiconductor light emitting device that is designed to enlarge an effective light emitting area using a plurality of active layers.

Technical Solution

An embodiment provides a semiconductor light emitting device comprising: a first electrode contacting layer, a first active layer on the first electrode contacting layer, a second electrode contacting layer on the first active layer, a second active layer on the second electrode contacting layer, and a third electrode contacting layer on the second active layer.

An embodiment provides a semiconductor light emitting device comprising: a plurality of first electrode contacting layers spaced apart from each other, a second electrode contacting layer between the first electrode contacting layers, a plurality of active layers between the first and second electrode contacting layers, and a first electrode electrically connected to the first electrode contacting layers.

An embodiment provides a method of fabricating a semiconductor light emitting device comprising: forming a first electrode contacting layer, forming a first active layer on the first electrode contacting layer, forming a second electrode contacting layer on the first active layer, forming a second active layer on the second electrode contacting layer, and forming a third electrode contacting layer on the second active layer.

Advantageous Effects

According to the embodiments, the effective light emitting area can enlarged as compared to a chip size of the semiconductor light emitting device.

In addition, a density of a current supplied to the semiconductor light emitting device can be reduced, the efficiency of the light emitting device can be improved.

Further, the reliability of the semiconductor light emitting device can be improved.

The details of one or more embodiments are set forth in the accompanying drawings and the description below.

Other features will be apparent from the description and drawings, and from the claims.

BEST MODE FOR CARRYING OUT THE INVENTION

Figure 1:
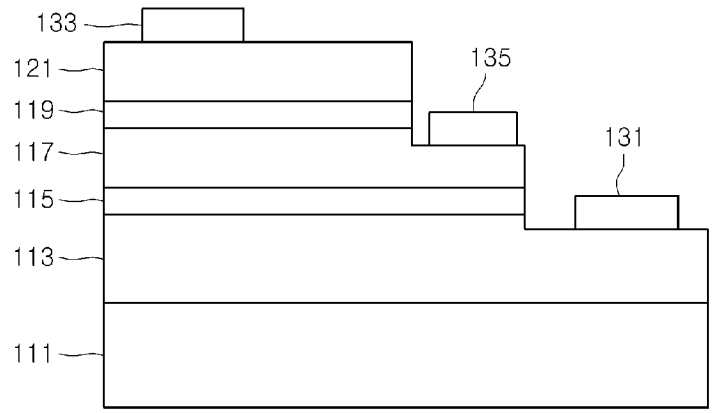
FIG. 1 is a cross-sectional view of a semiconductor light emitting device according to a first embodiment.

Hereinafter, semiconductor light emitting devices in accordance with embodiments will be described with reference to the accompanying drawings. Reference will now be made in detail to the embodiments of the present disclosure, examples of which are illustrated in the accompanying drawings. In the following description, words "above", "on", "below", and "under" are based on the accompanying drawings. In addition, a thickness of each layer is only exemplarily illustrated in the drawings and is not limited to the drawing.

FIG. 1 is a cross-sectional view of a semiconductor light emitting device according to a first embodiment.

Referring to FIG. 1, a semiconductor light emitting device 100 comprises a substrate 111, a first electrode contacting layer 113, a first active layer 115, a second electrode contacting layer 117, a second active layer 119, a third electrode contacting layer 121, first electrodes 131 and 133, and a second electrode 135.

The substrate 111 may be formed of one selected from the group consisting of a sapphire ($Al_2O_3$) substrate, a GaN substrate, a SiC substrate, a ZnO substrate, a Si substrate, a GaP substrate, a substrate containing metal, or a conductive substrate.

Figure 14:
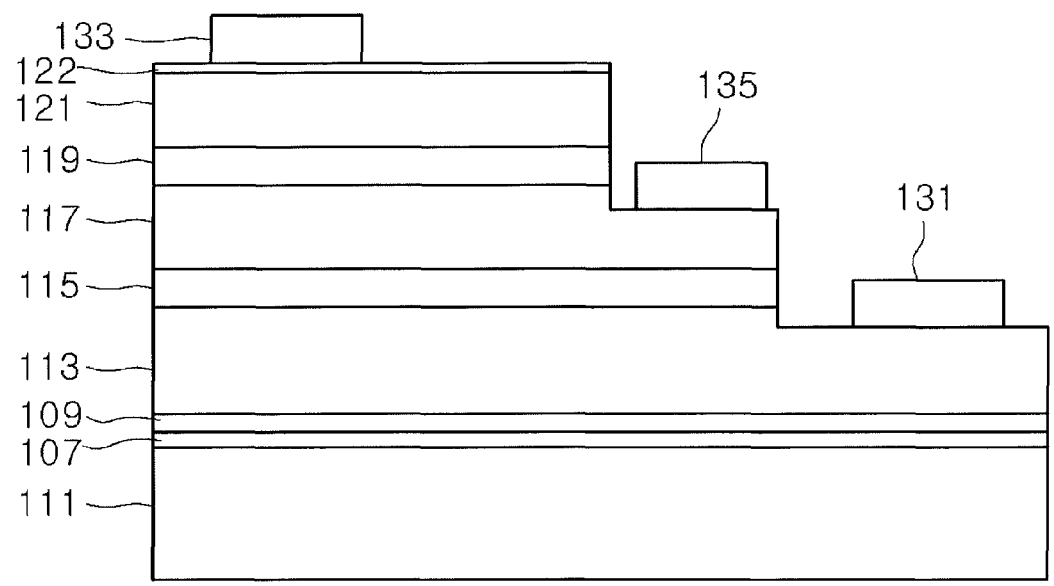
FIG. 14 is a schematic view of mounting of a semiconductor light emitting device according to a sixth embodiment.

A buffer layer 107 is formed on the substrate 111. The buffer layer may be formed of at least one of GaN, AlN, AlGaN, InGaN, and AlGaInN. An undoped semiconductor layer 109 may be formed on the substrate 111 or the buffer layer 107. The undoped semiconductor layer 109 may be formed of undoped GaN, as depicted in FIG. 14.

The first electrode contacting layer 113 is formed on the substrate 111. The first electrode contacting layer 113 comprises at least one n-type semiconductor layer and doped with n-type dopants. The n-type semiconductor layer may be formed of a compound semiconductor material selected from the group consisting of GaN, InN, AlN, InGaN, AlGaN, InAlGaN, AlInN, and a combination thereof. The n-type dopants comprise IV group elements such as Si, Ge, Sn, Se, Te, and the like.

The first active layer 115 is formed on the first electrode contacting layer 113. The first active layer 115 may be formed in a single quantum well structure or a multi-quantum well structure. The first active layer 115 is formed of a material having a band gap energy in accordance with a wavelength of light emitted. For example, for blue light-emitting having a wavelength of 460-470nm, the first active layer 115 may be formed of the single quantum well structure or a multi-quantum well structure with one cycle of an InGaN well layer/GaN barrier layer. Here, the $In_xGa_{1-x}N$ well layer may be adjusted to satisfy the following: $0 \leq x \leq 1$. The first active layer 115 may comprise a material emitting colored light such as light having a blue wavelength, light having a red wavelength, and light having a green wavelength.

The second electrode contacting layer 117 is formed on the first active layer 115. The second electrode contacting layer 117 comprises at least one p-type semiconductor layer and doped with p-type dopants. The p-type semiconductor layer may be formed of a compound semiconductor material selected from the group consisting of GaN, InN, AlN, InGaN, AlGaN, InAlGaN, AlInN, and a combination thereof. The p-type dopants comprise a II group element such as Mg, Zn, Ca, Sr, Ba, and the like.

The second active layer 119 is formed on the second electrode contacting layer 117. The second active layer 119 is formed of a same material as the first active layer 115. For example, the second active layer 119 may be grown as an InGaN well layer/GaN barrier layer structure. However, a material for the first and second active layers 115 and 119 are not specifically limited. That is, the material for the first and second active layers 115 and 119 may vary in accordance with the wavelength of light that will be emitted. Growing cycles of the well layer/barrier layer structures of the respective first and second active layers 115 and 119 may be same as or different from each other.

In addition, a clad layer (not shown) may be formed on or underneath the first and/or second active layers 115 and 119. The clad layer may be an AlGaN layer. However, the present disclosure is not limited to this.

The third electrode contacting layer 121 is formed on the second active layer 119. The third electrode contacting layer 121 comprises at least one n-type semiconductor layer and doped with n-type dopants. The n-type semiconductor layer may be formed of a compound semiconductor material selected from the group consisting of GaN, InN, AN, InGaN, AlGaN, InAlGaN, AlInN, and a combination thereof. The n-type dopants comprise IV group elements such as Si, Ge, Sn, Se, Te, and the like. Here, as the word "third electrode contacting layer 121" is just for the descriptive convenience, it has a same function as the first electrode contacting layer 113.

A transparent electrode layer (not shown) may be formed on the third electrode contacting layer 121.

The materials for the respective first and third electrode contacting layers 113 and 121 may be same as or different from each other. However, the present disclosure is not limited to this. The first and third electrode contacting layers 113 and 121 may be the n-type semiconductor layers while the second electrode contacting layer 117 is the p-type semiconductor layer. Alternatively, The first and third electrode contacting layers 113 and 121 may be the p-type semiconductor layers while the second electrode contacting layer 117 is the n-type semiconductor layer. In addition, a thin n-type or p-type semiconductor layer 122 may be formed on the third electrode contacting layer 121, as depicted in FIG. 14.

After the third electrode contacting layer 121 or the transparent electrode is formed, a MESA etching process is performed to expose a part of the first electrode contacting layer 113 and a part of the second electrode contacting layer 117. The first electrodes 131 and 133 are formed on the respective first and third electrode contacting layers 113 and 121. The second electrode 135 is formed on the second electrode contacting layer 117. One of the first electrodes 131 and 133 may be omitted.

The first electrodes 131 and 133 may be formed of a material selected from the group consisting of Ti, Al, In, Ta, Pd, Co, Ni, Si, Ge, Ag, Au, and a combination thereof. Each of the first electrodes 131 and 133 may be a single layer structure or a multi-layer structure. However, the present disclosure is not limited to this. The second electrode 135 may be formed of a material selected from the group consisting of Ag, Ag alloy, Ni, Al, Al alloy, Rh, Pd, Jr, Ru, Mg, Zn, Pt, Au, Hf, and a combination thereof. The second electrode 135 may be a single layer structure or a multi-layer structure. However, the present disclosure is not limited to this.

Here, the first electrodes 131 and 133 formed on the respective first and third electrode contacting layers 113 and 121 may be interconnected by a wire or a conductive thin film.

The semiconductor light emitting device 100 comprises the plurality of active layers 115 and 119 and thus the effective light emitting area is enlarged by two times as compared to a same size chip.

Figure 2:
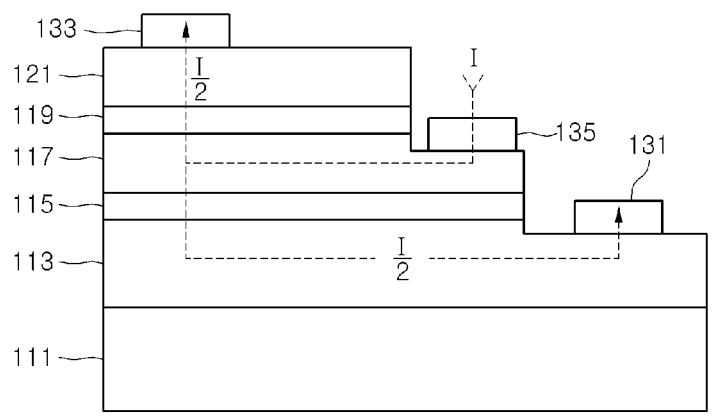
FIG. 2 is a schematic view illustrating a current path of FIG. 1.
Figure 3:
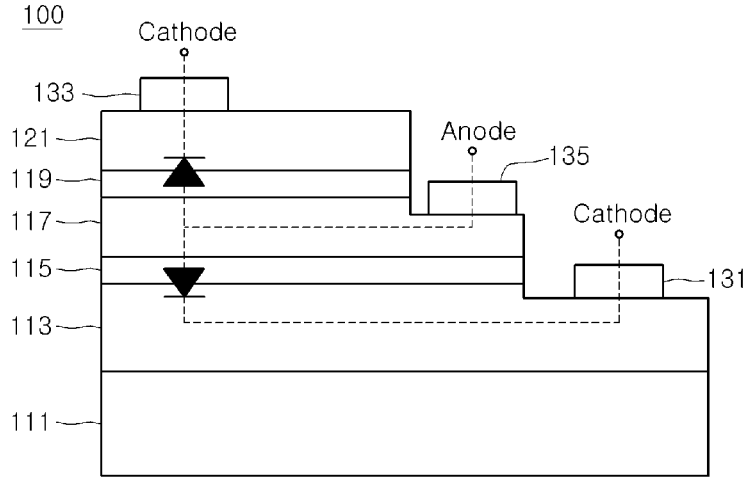
FIG. 3 is a schematic view of a semiconductor light emitting device according to a first embodiment.

FIG. 2 is a schematic view illustrating a current path of FIG. 1, and FIG. 3 is a schematic view of a semiconductor light emitting device according to a first embodiment.

Referring to FIG. 2, when a current I is supplied to the electrodes 131, 135, and 133, half of the current I supplied to the second electrode contacting layer 117 is transferred to the first electrode contacting layer 113 through the first active layer 115 and the other half of the current I is transferred to the third electrode contacting layer 121 through the second active layer 119. As a result, the semiconductor light emitting device 100 can be driven with a less operational voltage that an existing device even when a same current as the existing device is supplied while a similar intensity of the light is output.

In addition, in the semiconductor light emitting device 100, the current density is reduced by half and the operational voltage is reduced, thereby improving the luminance efficiency. At this point, the intensity of the light is the same as the existing device.

Figure 4:
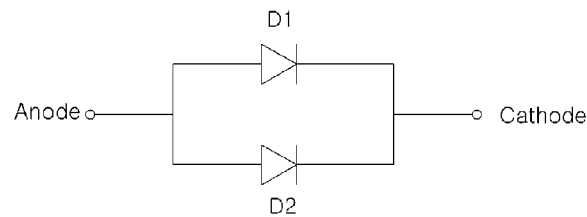
FIG. 4 is a circuit diagram of a light emitting diode of FIG. 3.

FIG. 3 is a schematic view of a semiconductor light emitting device according to a first embodiment, and FIG. 4 is a circuit diagram of a light emitting diode of FIG. 3.

Referring to FIGS. 3 and 4, the semiconductor light emitting device 100 is structured such that the second electrode contacting layer 117 is disposed between the first and third electrode contacting layers 113 and 121 and the first and second active layers 115 and 119 are disposed between the first and third electrode contacting layers 113 and 121. Therefore, the first electrode contacting layer 113, the first active layer 115, and the second electrode contacting layer 117 formed a first light emitting diode CHEN and the third electrode contacting layer 121, the second active layer 119, and the second electrode contacting layer 117 formed a second light emitting diode SHIM.

The first and second light emitting diodes D1 and D2 may be arranged in parallel in terms of a circuit structure.

The first electrodes 131 and 133 on the respective first and third electrode contacting layers 113 and 121 may function as cathodes that are commonly connected. The second electrode 135 on the second electrode contacting layer 117 may function as an anode.

Figure 5:
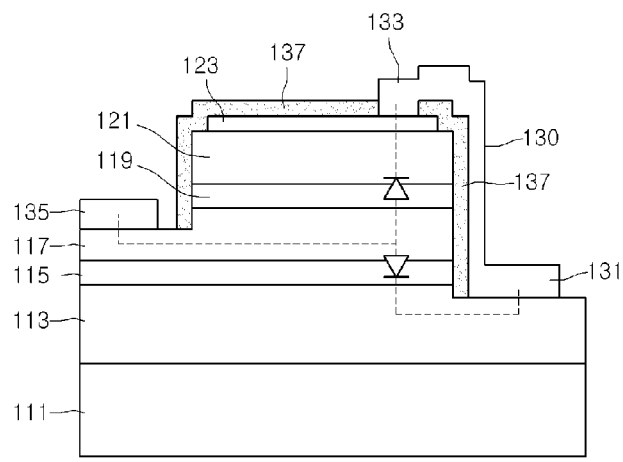
FIG. 5 is a schematic view of a semiconductor light emitting device according to a second embodiment.

FIG. 5 is a schematic view of a semiconductor light emitting device according to a second embodiment. In the following description, same parts as those of the first embodiment will refer to the first embodiment and detailed description thereof will be omitted.

Referring to FIG. 5, a transparent electrode layer 123 may be formed on the third electrode contacting layer 121. The transparent electrode layer 123 is a transparent oxide layer that is formed to enhance the diffusion of the current on an entire surface of the chip. The transparent electrode may be formed of ITO, ZnO, RuOx, TiOx, IrOx, and the like.

A part of the first electrode contacting layer 113 and a part of the second electrode contacting layer 117 are exposed through a MESA etching process. Here, electrode forming regions may be formed by etching insulating layers 137 formed on a surface of the semiconductor layer. Alternatively, the insulating layers 137 may be formed on the surface of the semiconductor layer except for the electrode forming regions. That is, the electrode forming method is not specifically limited.

The first electrodes 131 and 133 are formed on the first electrode contacting layer 113 and the transparent electrode layer 123, respectively. The second electrode 135 is formed on the second electrode contacting layer 117. Here, the first electrode 133 may be formed on the third electrode contacting layer 121.

The first electrode 131 on the first electrode contacting layer 113 and the first electrode 133 on the transparent electrode layer 123 may be interconnected by an electrode connecting layer 130. The electrode connecting layer 130 is formed on the insulating layer 137 to be electrically insulated from other semiconductor layers. Here, the electrodes 131 and 133, the electrode connecting layer 130, and the insulating layers 137 may be grown through a PECVD or sputtering process. However, the present disclosure is not limited to this.

Figure 6:
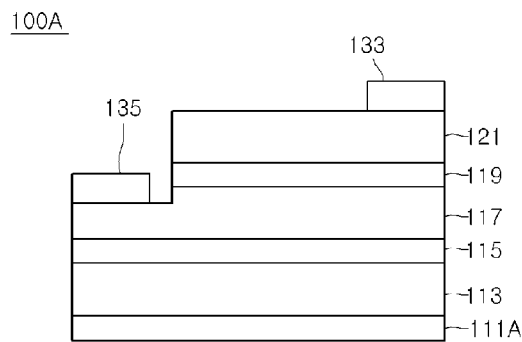
FIG. 6 is a schematic view of a semiconductor light emitting device according to a third embodiment.

FIG. 6 is a schematic view of a semiconductor light emitting device according to a third embodiment. In the following description, same parts as those of the first embodiment will refer to the first embodiment and detailed description thereof will be omitted.

Referring to FIG. 6, a vertical type semiconductor light emitting device 100A is structured to have a conductive substrate 111A at its lower portion. The conductive substrate 111A may be formed after removing the substrate 111 of FIG. 1 or by making the substrate 111 of FIG. 1 conductive. The removal of the substrate may be realized through a laser lift off (LLO) process.

The conductive substrate 111A is provided to support a light emitting diode chip. The conductive substrate 111A may be formed of Si or Mo and attached to the device. Alternatively, the conductive substrate 111A may be formed by thickly plating Cu.

Since the conductive substrate 111A is electrically connected to the first electrode contacting layer 113, there is no need to form the first electrode or to perform the MESA etching process.

Figure 7:
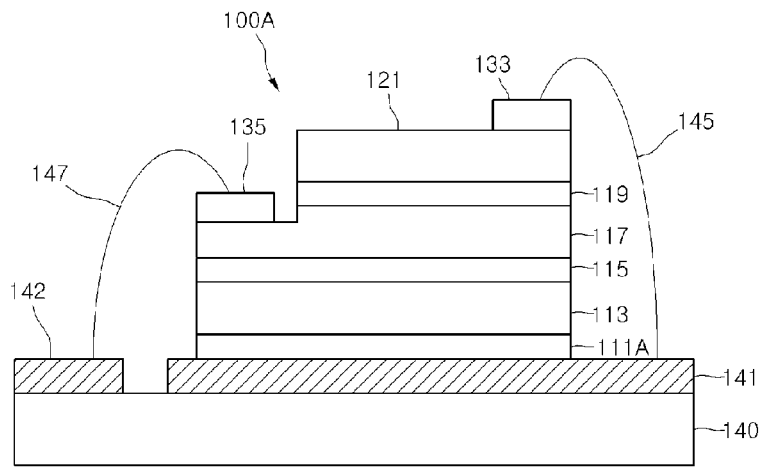
FIG. 7 is a schematic view illustrating mounting of the semiconductor light emitting device of FIG. 6.

FIG. 7 is a schematic view illustrating mounting of the semiconductor light emitting device of FIG. 6.

Referring to FIG. 7, the vertical type semiconductor light emitting device 100A is mounted on a sub-mount 140. The sub-mount 140 may be a semiconductor substrate formed of SiC, GaN, GaAs, Si, and the like, a lead frame type support, an electroplating type support, or a normal PCB, a flexible PCB. However, the present disclosure is not limited to this configuration.

The conductive substrate 111A is attached on a first electrode pad 141 of the sub-mount 140 by conductive adhesive. The first electrode 133 on the third electrode contacting layer 121 is connected to the first electrode pad 141 of the sub-mount 140 by a wire 145.

The second electrode 135 on the second electrode contacting layer 117 may be connected to the second electrode pad 142 of the sub-mount 140 by a wire 147.

Figure 8:
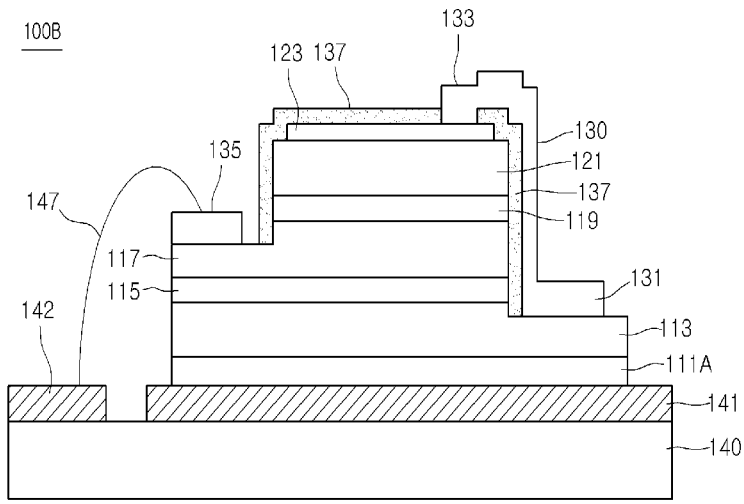
FIG. 8 is a schematic view illustrating mounting of a semiconductor light emitting device according to a fourth embodiment

FIG. 8 is a schematic view illustrating mounting of a semiconductor light emitting device according to a fourth embodiment. In the following description, same parts as those of the second embodiment will refer to the second embodiment and detailed description thereof will be omitted.

Referring to FIG. 8, a semiconductor light emitting device 100B is structured to have a conductive substrate 111A at its lower portion, and structured to be mounted on a sub-mount by one wire 147. The conductive substrate 111A is attached on the first electrode pad 141 of the sub-mount 140 by the conductive adhesive so that the first electrode pad 141 can be electrically connected to the first electrode contacting layer 113. The first electrode 131 on the first electrode contacting layer 113 is electrically connected to the first electrode 133 on the transparent electrode layer 123 through the electrode connecting layer 130.

The second electrode 135 of the second electrode contacting layer 117 is connected to the second electrode pad 142 of the sub-mount by the wire 147.

The third electrode contacting layer 121 is connected to the first electrode 133 through the transparent electrode layer 123, the first electrodes 131 and 133 are connected through the electrode connecting layer 130, the conductive substrate 111A is connected to the first electrode 131 through the first electrode connecting layer 113, and the first electrode pad 141 is connected to the conductive substrate 111A.

Figure 9:
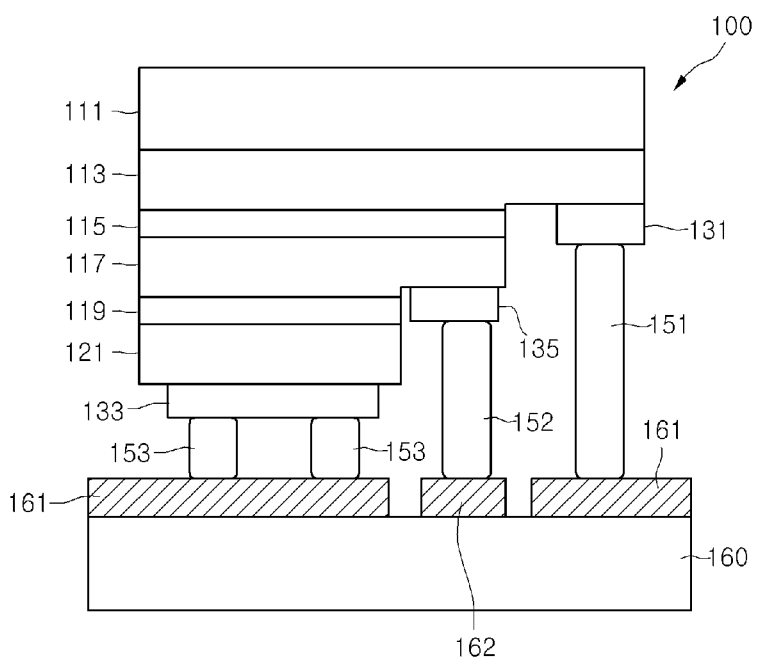
FIG. 9 is a schematic view illustrating flip-type mounting of the semiconductor light emitting device according to the first embodiment.

FIG. 9 is a schematic view illustrating flip-type mounting of the semiconductor light emitting device according to the first embodiment.

Referring to FIG. 9, the first electrode 131 of the semiconductor light emitting device 100 is connected to a first electrode pad 161 of a sub-mount 160 by a first bump (e.g., Au bump) 151. The second electrode 135 is connected to a second electrode pad 162 of the sub-mount 160 by a second bump 152. The first electrode 133 is connected to the first electrode pad 161 of the sub-mount 160 by a third bump 153.

Figure 10:
FIGS. 10 to 12 are cross-sectional views illustrating a method of fabricating a semiconductor device according to a fifth embodiment.
Figure 11:
Figure 12:
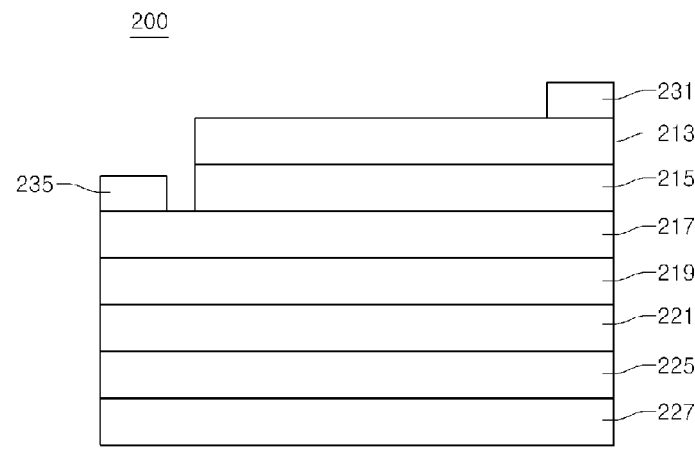

FIGS. 10 to 12 are cross-sectional views illustrating a method of fabricating a semiconductor device according to a fifth embodiment. In the following description, component parts of the fifth embodiment which are the same as those of the first embodiment are not described.

Referring to FIG. 10, a first electrode contacting layer 213 is formed on a substrate 211 and a first active layer 215 is formed on the first electrode contacting layer 213. A second electrode contacting layer 217 is formed on the first active layer 215. A second active layer 219 is formed on the second electrode contacting layer 217 and a third electrode contacting layer 221 is formed on the second active layer 219. A variety of other layers such as a buffer layer or/and an undoped GaN layer may be formed between the substrate 211 and the first electrode contacting layer 213.

Referring to FIG. 11, a reflective electrode layer 225 is formed on the third electrode contacting layer 221 and a conductive supporting member 227 is formed on the reflective electrode layer 225. The reflective electrode layer 225 comprises Al, Ag, Pd, Rh, Pt, and the like. The conductive supporting member 227 may be formed of copper or gold. However, the present disclosure is not limited to this.

Referring to FIGS. 11 and 12, the substrate 121 is removed through the LLO process and the conductive supporting member 227 is located on the base. Here, the variety of other layers formed between the substrate 121 and the first electrode contacting layer 213 may be removed through a dry or wet etching process.

After the above, a part of the second electrode contacting layer 217 is exposed through a MESA etching process. A second electrode 235 is formed on the second electrode contacting layer 217 and a first electrode 231 is formed on the first electrode contacting layer 213.

Figure 13:
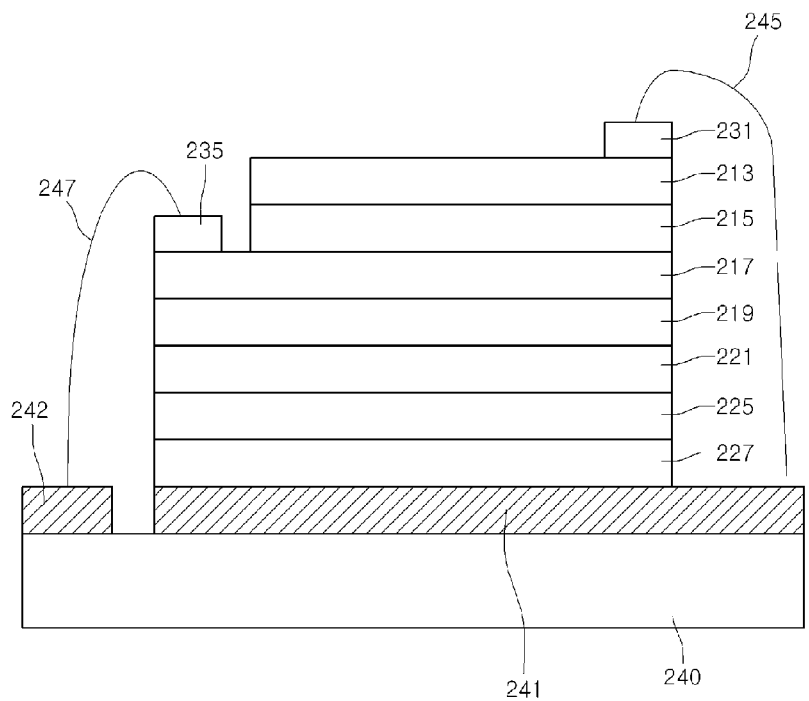
FIG. 13 is a schematic view of mounting of a semiconductor light emitting device according to the fifth embodiment.

FIG. 13 is a schematic view of mounting of a semiconductor light emitting device according to the fifth embodiment.

Referring to FIG. 13, the first electrode 231 is connected to a first electrode pad 241 of a sub-mount 240 by a wire 245 and the second electrode 235 is connected to a second electrode pad 242 of the sub-mount by a wire 247.

According to the semiconductor light emitting device of the embodiment, the light emitting area can be enlarged by forming the plurality of active layers. That is, the effective area of the light emitting region can be enlarged in the same LED chip. In addition, the current density is reduced to improve the luminance efficiency.

In addition, each layer of the semiconductor light emitting device of the embodiment comprises a compound semiconductor using elements of III-V group. For example, the layers may be formed of a GaN-based, GaAs-based, InGaAlPbased, or AlGaAs-based material.

In the following description, it will be understood that when a layer (or film) is referred to as being on another layer or substrate, it can be directly on the another layer or substrate, or intervening layers may also be present. Further, it will be understood that when a layer is referred to as being under another layer, it can be directly under the another layer, and one or more intervening layers may also be present. In addition, it will also be understood that when a layer is referred to as being between two layers, it can be the only layer between the two layers, or one or more intervening layers may also be present.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

According to the embodiments, the effective light emitting area can enlarged as compared to a chip size of the semiconductor light emitting device.

In addition, a density of a current supplied to the semiconductor light emitting device can be reduced, the efficiency of the light emitting device can be improved.

Further, the reliability of the semiconductor light emitting device can be improved.

The invention claimed is:

1. A semiconductor light emitting device, comprising:
   a first electrode contacting layer including a p-type dopant;
   a first active layer on the first electrode contacting layer;
   a second electrode contacting layer on the first active layer and including an n-type dopant;
   a second active layer on the second electrode contacting layer;
   a third electrode contacting layer on the second active layer and including a p-type dopant;
   a first electrode on a region of a top surface of the third electrode contacting layer;
   a second electrode on a region of a top surface of the second electrode contacting layer;
   a reflective electrode layer disposed under the first electrode contacting layer;
   a conductive support member disposed under the reflective electrode layer;
   a first electrode pad under the conductive support member;
   a sub-mount under the first electrode pad; and
   a second electrode pad electrically connected to the second electrode,
   wherein the first and second active layers include a well layer and a barrier layer,
   wherein the first and second active layers and the first, second and third electrode contacting layers are formed of a nitride-based semiconductor layer,
   wherein the reflective electrode layer vertically overlaps the first and second active layers,
   wherein the reflective electrode layer is formed of a different metal from a metal of the conductive support member,
   wherein a lateral width of the first electrode pad is greater than a lateral width of the reflective electrode layer,
   wherein the first electrode is electrically connected to the first electrode pad, and
   wherein both the first electrode pad and the second electrode pad are disposed on a top surface of the sub-mount.

2. A semiconductor light emitting device comprising:
   a first electrode contacting layer comprising a first semiconductor layer and a second semiconductor layer, the first and second semiconductor layers formed of a p-type nitride-based semiconductor layer, the second semiconductor layer being disposed under the first semiconductor layer;
   a plurality of active layers disposed between the first and second semiconductor layers;
   a second electrode contacting layer between the plurality of active layers and including an n-type nitride-based semiconductor layer;
   a second electrode physically contacting the first electrode contacting layer;

a first electrode disposed on the first semiconductor layer;
a reflective electrode layer disposed under the second semiconductor layer;
a conductive support member disposed under the reflective electrode layer;
a first electrode pad under the conductive support member;
a sub-mount under the first electrode pad; and
a second electrode pad electrically connected to the second electrode,
wherein the plurality of active layers include a well layer and a barrier layer,
wherein the plurality of active layers are formed of a nitride-based semiconductor layer,
wherein the reflective electrode layer vertically overlaps the plurality of active layers,
wherein the reflective electrode layer is formed of a different metal from a metal of the conductive support member,
wherein a lateral width of the first electrode pad is greater than a lateral width of the reflective electrode layer,
wherein the first electrode is electrically connected to the first electrode pad, and
wherein both the first electrode pad and the second electrode pad are disposed on a top surface of the sub-mount.

3. The semiconductor light emitting device according to claim 1, wherein each of the first and second active layers includes an InGaN well layer and a GaN-based barrier layer.

4. The semiconductor light emitting device according to claim 2, wherein the plurality of active layers includes the well and barrier layers having a same cycle within each active layer.

5. The semiconductor light emitting device according to claim 1, further comprising a first wire connected to the first electrode and a second wire connected to the second electrode.

6. The semiconductor light emitting device according to claim 1, wherein the well layer of the first active layer is formed of a same semiconductor material as the well layer of the second active layer, and
wherein the well and barrier layers of the first active layer have a same cycle as a cycle of the well and barrier layers of the second active layer.

7. The semiconductor light emitting device according to claim 3, wherein the well and barrier layers of the first active layer have a same cycle as a cycle of the well and barrier layers of the second active layer.

8. The semiconductor light emitting device according to claim 1, wherein the first and third electrode contacting layers are electrically connected to the first electrode pad.

9. The semiconductor light emitting device according to claim 1, wherein the conductive support member includes at least one of Cu and Au and the reflective electrode layer includes at least one of Al, Ag, Pd and Pt.

10. The semiconductor light emitting device according to claim 2, wherein the first semiconductor layer and the second semiconductor layer are electrically connected to the first electrode pad.

11. The semiconductor light emitting device according to claim 2, wherein the conductive support member includes at least one of Cu and Au and the reflective electrode layer includes at least one of Al, Ag, Pd and Pt.

12. The semiconductor light emitting device according to claim 1, wherein the lateral width of the reflective electrode layer is greater than a lateral width of the second active layer.

13. The semiconductor light emitting device according to claim 2, wherein the plurality of active layers comprises a first active layer on the first electrode contacting layer and a second active layer on the second electrode contacting layer,
wherein the first active layer is on the second semiconductor layer, and
wherein the lateral width of the reflective electrode layer is greater than a lateral width of the second active layer.

14. The semiconductor light emitting device according to claim 1, wherein a bottom surface of the first electrode pad is flush with a bottom surface of the second electrode pad.

15. The semiconductor light emitting device according to claim 2, wherein a bottom surface of the first electrode pad is flush with a bottom surface of the second electrode pad.

16. The semiconductor light emitting device according to claim 5, wherein the first electrode is directly connected to the first electrode pad by the first wire.

17. The semiconductor light emitting device according to claim 2, further comprising a first wire directly connecting the first electrode to the first electrode pad.

* * * * *